(12) United States Patent
Kim

(10) Patent No.: US 6,583,486 B2
(45) Date of Patent: Jun. 24, 2003

(54) SEMICONDUCTOR MEMORY DEVICE AND ITS METHOD OF MANUFACTURE

(75) Inventor: Han-Soo Kim, Gyeonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/068,175

(22) Filed: Feb. 6, 2002

(65) Prior Publication Data

US 2002/0105047 A1 Aug. 8, 2002

(30) Foreign Application Priority Data

Feb. 7, 2001 (KR) .......................................... 2001-5866

(51) Int. Cl.$^7$ .......................................... H01L 27/095
(52) U.S. Cl. .................. 257/484; 257/127; 257/170; 257/409; 257/452; 257/602; 438/257; 438/223; 438/570
(58) Field of Search ................ 257/127, 170, 257/339, 372–376, 394–400, 409, 452, 484, 490, 493–495, 605; 438/257, 223, 224, 227, 228, 48, 570, 140, 454

(56) References Cited

U.S. PATENT DOCUMENTS 5,204,541 A * 4/1993 Smayling et al. ............ 257/138
5,396,100 A * 3/1995 Yamasaki et al. ............ 257/205
6,111,271 A * 8/2000 Snyman et al. ................ 257/80

* cited by examiner

*Primary Examiner*—David Nelms
*Assistant Examiner*—Long Tran
(74) *Attorney, Agent, or Firm*—Marger Johnson & McCollom

(57) ABSTRACT

A semiconductor memory device comprises a semiconductor substrate having a memory cell region and a periphery circuit region. The memory cell region includes first and second conductivity type wells and an array of memory cell formed on the first and second conductivity type wells. The periphery circuit region comprises a guard ring that is formed at a location next to a second conductivity type well and to surround a side portion of the array of memory cells. The guard ring is formed with a depth different from that of the second conductivity type well.

16 Claims, 13 Drawing Sheets

SEMICONDUCTOR MEMORY DEVICE AND ITS METHOD OF MANUFACTURE

CROSS REFERENCE

This application claims benefit and priority of Korean Patent Application No. 2001-5866, filed on Feb. 7, 2001, under 35 U.S.C. §119, the entirety of which is hereby incorporated by reference.

BACKGROUND OF THE INVENTION

1. Field of the invention

The present invention relates to a semiconductor memory device, and more particularly, to a semiconductor memory device having a guard ring.

2. Description of Related Art

In a semiconductor memory device, it may be desirable to prevent noise of an external signal from adversely affecting its performance. For example, an external signal may propagate from a terminal to a pad of the semiconductor memory device. If the signal carries a negative undershoot to the pad, the negative undershoot may generate minority carriers, e.g., electrons, in the semiconductor material of the memory device. Such minority carrier noise (e.g., electrons) might then reach and adversely affect memory cells of the memory device.

To avoid such problems, an n-well may be formed in a ring shape surrounding the array of memory cells to serve as guard ring for absorbing minority carriers that may be in the substrate. For example, the guard ring may collect electrons that may be generated by a negative undershoot signal. By collecting such noise electrons, the guard ring prevents the noise electrons from reaching the memory cells of the memory device so that data of the memory cells can remain stable.

Japanese Patent Laid-Open Publication No. hei 6-85203 describes a semiconductor memory device with n-well regions to suppress such noise. The semiconductor memory device includes an I/O circuit region, a periphery circuit region and a memory cell region. In the I/O circuit region, an n-well is formed to surround p-well portions of the I/O circuit region. The n-well of the I/O circuit region is provided a depth deeper than that of the n-well for the periphery circuit region. Similarly, an n-well is formed to surround p-well portions of the memory cell region and is provided a depth deeper than that of the n-wells of the periphery circuit region.

However, for the semiconductor memory device of Japanese Patent Laid-Open Publication No. hei 6-85203, problems may exist with provision of its protective n-wells if the memory cell regions are to become more dense. The n-wells of this memory device may adversely affect an isolation margin (and process margin) between wells of the memory cell region when such designs evolve to higher levels of integration. Accordingly, they can limit the level of integration that might otherwise be available for the memory device.

Additionally, in order to surround the side and bottom portions of the p-wells, the depth of the p-wells is kept less than that of the surrounding n-well. As a result, the push for higher levels of integration will require further reductions in depth for the p-wells, which may affect increased resistance and an increased risk for latch-up. Additionally, the isolation between n+ dopant regions (e.g., source and drain regions of a NMOS transistor) that may be formed in the p-well might also be reduced.

In order to overcome some of the above problems, a semiconductor memory device may have an n-well formed for the periphery circuit region, which will allow for improved levels of integration and enhanced densities for the memory cell region.

FIG. 1 is a simplified plan view illustrating a semiconductor memory device with a guard ring. The semiconductor memory device includes a memory cell region 101 and a periphery circuit region 102. In FIG. 1, the separate memory and periphery regions may be delineated by the one-dot line. Memory cell region 101 includes n-wells 110, p-wells 120 and a plurality of unit cells 141. In FIG. 1, a dotted line delineates the unit cells 141. As shown in this embodiment, the cells may be arranged in a matrix pattern for an array 140. Also, the periphery circuit region 102 may include p-well 125 and n-well 130. N-well 130 may be formed to surround sides of cell array 140 of the memory cell region 101 and may serve as a guard ring to collect electrons that might be generated within the substrate by, e.g., a negative undershoot signal.

In one example, unit cell 141 may comprise an SRAM cell, which may be classified as a full CMOS cell, a high road resistor (HRL) or thin film transistor (TFT) cell as determined in accordance with the type of load. The full CMOS cell, which is more common, uses a bulk PMOS transistor for its load element and comprises two bulk PMOS transistors and four bulk NMOS transistors. Thus, referencing FIG. 1, the memory cell region 101 for the conventional semiconductor memory device may include n-wells 110 for the formation of bulk PMOS transistors and p-well regions 120 for the formation of bulk NMOS transistors.

The n-wells 110, 130 may be formed in respective regions of memory cell region 101 and the periphery circuit region 102, respectively. These n-wells, for the conventional device, are formed at the same time during a single ion implantation process via a common mask. Such exemplary process for manufacturing a semiconductor memory device of FIG. 1, is explained below with reference to FIGS. 2A, 2B, 3A, and 3B. FIGS. 2A and 2B are cross-sectional views taken along line II—II of FIG. 1, and FIGS. 3A and 3B are cross-sectional views taken along line III—III of FIG. 1.

Referring to FIGS. 2A and 3A, a first mask pattern 151 is formed so as to leave exposed portions of, e.g., a p-type semiconductor substrate 100. The exposed portions will correspond to the desired regions for the n-wells. N-type impurities are then ion-implanted into the exposed areas to form n-wells 110 in the memory cell region 101 and n-well 130 in the periphery circuit region 102 as defined by mask pattern 151. As previously described, the regions of n-well 110 may be used to form PMOS transistors in the memory cell region 101, while the regions of n-well 130 may surround the array of cell 140 of the memory cell region 101 to serve as a guard ring. At this point, PMOS transistors may also be formed on the n-well 130 of the periphery circuit region. After forming n-wells 110, 130, the first mask pattern 151 may be removed.

Sequentially, with reference to FIGS. 2B and 3B, a second mask pattern 152 may be formed and patterned to expose portions of the semiconductor substrate 100 where p-wells may be formed. P-type impurities may then be ion-implanted into exposed regions of the substrate to form p-wells 120 in the memory cell region 101 and p-wells 125 in the periphery circuit region 102 as defined by the mask pattern 152. The p-wells 120 of the memory cell region may be located between two neighboring n-wells 110, and the p-wells 125 of the periphery region may be formed on both sides of n-well 130.

As described above, n-well 130 may act as a guard ring to surround a side portion of the memory's cell array 140 (FIG. 1). But given that n-wells 110 and 130 are formed by the same process step, i.e., through a common one-time ion implantation process that uses a common mask, the n-wells 110 and 130 will have substantially the same depth.

To assist electron collection, the n-well for the guard ring, with reference to the cross-sectional view of FIGS. 4–5, is to effect an electric field through a depletion region and across a PN junction that are formed between the n-well and p-well.

Further referring to FIG. 5, n-well 130 and p-well 125 meet to form a PN junction. A depletion region DR results across the interface of p-well 125 and n-well 130, which may be centered about the PN junction or surface JS. An electric field is formed across the depletion region and may be directed from the n-well 130 toward the p-well 125. Since electrons 126 have a negative polarity, they move in a direction opposite an electric field. Accordingly, electrons 126 may move from regions of p-well 125 to n-well 130 to be collected by the n-well.

Referring to FIG. 4, it is assumed that the substrate 100 comprises, for example, a p-type semiconductor substrate. The region of p-well 125 may comprise p-type dopants of an implant patterned in the periphery region of the semiconductor substrate 100. N-well 130 is formed to surround an array of memory cells of a memory cell region (e.g., 101 of FIG. 1). A PN junction may result between the regions of p-well 125 and n-well 130. Again, a depletion layer results between the p-well 125 and n-well 130 to effect an electric field across the junction.

Electrons 126, 160, respectively, may be generated (e.g., as minority carriers) in p-well 125 and the p-type material of semiconductor substrate 100. These electrons will move toward n-well 130 under the influence of the electric field E associated with depletion region DR. N-well 130, therefore, is able to collect these electrons 126 and 160 and may prevent them from reaching memory cells 141 (FIG. 1) of the memory cell region. N-well 130 thus shields the memory cells 141 from the stray electrons in order to avoid abnormal operations thereof.

It is understood that if n-well 130 can be made larger (i.e., increased width W1 and depth D1 (see FIGS. 2B and 3B)), then the depletion region DR and associated electric field may likewise increase. Accordingly, the larger n-well might then be able to collect more electrons. By collecting more electrons, the n-well would improve noise tolerance by reducing the risk of electrons reaching the memory cell.

However, there may be a limitation to the amount that a width of the n-well guard ring can be increased. When the size of a memory chip is reduced for increasing its level of integration, preferably, all patterns that are associated with the memory chip may be reduced and scaled similarly. Accordingly, the increased levels of integration will call for a reduced width of the n-well that is to act as the guard ring. Therefore, the amount of charge that may be collected by the guard ring would decrease with such higher levels of integration.

To improve the magnitude of an electric field that results from the guard ring might then require an increase for the depth of the n-well associated with the guard ring. However, with n-wells 110, 130 being formed simultaneously in respective memory and periphery regions 101, 102; an increase for the depth of the guard ring would likewise effect a similar increase in depth for the n-wells of the memory cell region. To increase their n-type impurity depths, the n-wells would have to be made with greater ion implantation energy. But such implant energy increase might then adversely affect a process isolation margin. It is understood that a lateral diffusion associated with impurity implants may be proportional to ion implantation energy. Accordingly, a process margin—i.e., for an isolation need between wells in the memory cell region—might thus be compromised by the greater ion implantation energy. Therefore, there may be a limit to increasing the depth of such guard ring.

Again, as described above, semiconductor memory devices are becoming more highly integrated. With such increase in integration, the width of the n-well 130 that may act as the guard ring will decrease. In order to maintain an electron collection efficiency of the guard ring, there may be a need for increasing its depth. At the same time, it would be nice to be able to increase the depth of the guard ring without compromising process margins. Therefore, as semiconductor devices become more highly integrated, noise suppressing efficiency or electron collection abilities might be affected.

In an exemplary semiconductor memory device having a CMOS type SRAM cell, the memory cell may include two bulk PMOS transistors and four bulk NMOS transistors. PMOS transistors are formed in n-wells and NMOS transistors are formed in the p-wells, which wells may be formed in a memory cell region of the memory device. When an integration level is increased, the cell size is reduced. Accordingly, an isolation between the n-wells and the p-wells may become very important. In other words, an isolation needs to be preserved between the p-type impurity regions of the PMOS transistors that are formed in the n-wells relative to the neighboring p-wells. Also, an isolation need exist for keeping separate the n-type impurity regions of the NMOS transistor in the p-wells relative neighboring n-wells. These isolations can very important for assuring proper SRAM circuit performance. Many attempts have been made to preserve such isolations. For example, some solutions may use an isolation trench, and may provide for an increased depth for these isolation trenches.

Regardless, the formation of highly integrated memory cells of small size may require a process that enables a preservation of an isolation margin between wells as there densities increase. With reduced geometries, the isolation margin may become more sensitive to alignment errors—i.e., wherein such errors become more pronounced via the reduced geometries. Additionally, an ion implantation process associated with the formation of the wells may adversely affect a lateral diffusion tolerance when trying to form guard rings of sufficient electron collection efficiency. Therefore, the processes associated with ion-implants need to be precisely performed to provide effective guard rings while at the same time controlling implant energy for reduced lateral diffusions.

SUMMARY OF THE INVENTION

Exemplary embodiments of the present invention provide for a semiconductor memory device or a method of manufacturing a semiconductor device. Such exemplary embodiments may enable higher levels of device integration and offer improved noise tolerance.

Additionally, exemplary embodiments of the present invention may provide such devices and methods with effective isolation margins.

In accordance with an exemplary embodiment of the present invention, a semiconductor memory device comprises a semiconductor substrate having a memory cell region and a periphery circuit region. The memory cell region may include first and second conductivity type wells and a plurality of memory cells formed on the first and second conductivity type wells. The periphery circuit region may comprises a guard ring adjacent to the second conductivity type well and surrounding a side portion of the memory cell region. The guard ring comprises a depth different from the depth of the second conductivity type well of the memory cell region.

In accordance with another exemplary embodiment, a semiconductor memory device comprises a first conductivity type semiconductor substrate having memory cell and periphery circuit regions. First and second conductivity type wells may be formed on the memory cell region, and an array of memory cells formed on the first and second conductivity type wells. A first conductivity type well may be formed on a portion of the periphery circuit region adjacent the memory cell region. A well of the second conductivity may be formed adjacent to the well of the first conductivity type in the periphery circuit region and surrounding a side portion of the memory cell region. Additionally, it will have a depth deeper depth than the second conductivity type well of the memory cell region.

In accordance with still a further embodiment of the present invention, a semiconductor memory device comprises a semiconductor substrate having memory and periphery regions. A first conductivity type well may be formed in the memory cell region. A guard ring is formed in the periphery circuit region to surround a side portion of the memory cell region and with a depth different from that of the first conductivity-type well.

In another exemplary embodiment of the present invention, a semiconductor memory device comprises a first conductivity type semiconductor substrate. Wells of a first conductivity type are formed in memory and periphery circuit regions of the semiconductor substrate. A well of a second conductivity type is formed in the periphery circuit region surrounding a side portion of the memory cell region. The second conductivity type well is formed with a depth deeper than that of the first conductivity-type well in the memory cell region.

The present invention further provides for a method of manufacturing a semiconductor memory device. A first mask pattern is formed on a semiconductor substrate with openings to expose select regions of the substrate. Impurities of a first conductivity type may then be implanted with a first ion implantation energy into the select regions of the semiconductor substrate to form wells of the first conductivity type therein as defined by the first mask pattern. A second mask pattern may be formed over the semiconductor, and further impurities of the first conductivity type implanted with a second ion implantation energy into a select area of the periphery circuit region of the semiconductor substrate as defined by the second mask pattern. In this embodiment, the second ion implantation energy is greater than the first ion implantation energy. This method may further comprise forming a third mask pattern over the semiconductor substrate to expose portions thereof other than those of the first conductivity type wells. Second conductivity type impurities may then be implanted into areas of the semiconductor substrate as defined by the third mask pattern and second conductivity type wells formed in the memory cell and the periphery circuit regions of the semiconductor substrate.

In accordance with another embodiment of the present invention, a method of manufacturing a semiconductor memory device comprises forming a first mask pattern on a semiconductor substrate to expose a portion of a periphery circuit region thereof. Using a first ion implantation energy, impurities of a first conductivity type are implanted into regions of the semiconductor substrate defined by the first mask pattern to provide for the formation of a first conductivity type well in the periphery circuit region. A second mask pattern may then be formed over the semiconductor substrate to expose at least a portion of the first conductivity type well in the periphery circuit region and a portion of the memory cell region. Using a second ion implantation energy, additional impurities of the first conductivity type may then be implanted into areas of the semiconductor substrate defined by the second mask pattern to assist formation, or further formation, of first conductivity type wells in the memory cell and periphery circuit regions. In this embodiment, the magnitude of the second ion implementation energy is less than that of the first ion implantation energy. A third mask pattern may be formed on the semiconductor substrate to expose at least portions of the semiconductor substrate other than those for the first conductivity type wells. Impurities of a second conductivity type may then be implanted into regions of the semiconductor substrate defined by the third mask pattern to provide for the formation of second conductivity type wells in the memory cell and the periphery circuit regions of the semiconductor substrate.

In accordance with further exemplary embodiments, the semiconductor substrate may be prepared with a conductivity type that is the same as that of the first conductivity type well, and the guard ring may comprise material of the second conductivity type. For example, the semiconductor substrate may comprise a p-type semiconductor substrate and the guard ring may comprise an n-well. Additionally, the guard ring comprises a depth deeper than that of the second conductivity type well of the memory cell region. For example, the guard ring may comprise a depth that is at least 0.1 $\mu$m as deep as the second conductivity type well in the memory cell region. In further exemplary embodiments, the cells of the memory cell region comprise DRAM cells.

BRIEF DESCRIPTION OF THE DRAWINGS

For a more complete understanding of the present invention and the advantages thereof, reference is now made to the following descriptions taken in conjunction with the accompanying drawings, in which like reference numerals may denote like parts, and in which.

DETAILED DESCRIPTION OF PREFERRED EMBODIMENTS

Figure 1:
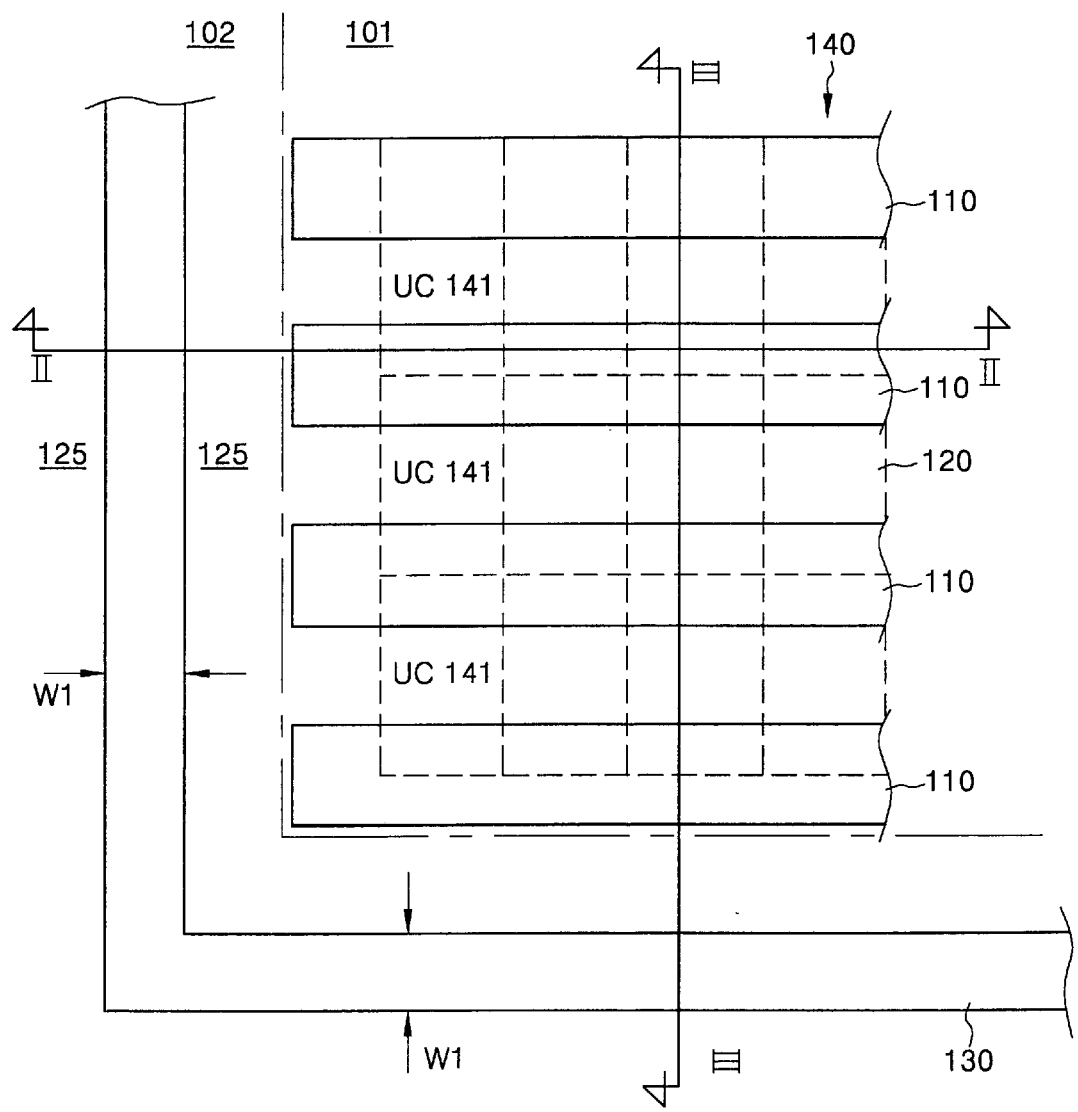
FIG. 1 is a plan view illustrating a conventional semiconductor memory device having a guard ring.

In the following description, numerous specific details may be set forth to provide an understanding of the present invention. However, it is understood that the present invention may be practiced without each of such specific details. In other instances, well-known elements may be shown in block diagram form in order to prevent obscuring the present invention with unnecessary detail. Additionally, certain elements in the drawings may not necessarily be drawn to scale.

As used herein, the term "well" may represent a dopant or conductivity implant region of a semiconductor substrate. Such "well" may comprise a depth that extends into the substrate and might, therefore, be alternatively viewed as a "well layer". But, for purposes of the present disclosure, such dopant or impurity implant region may be referenced as a "well".

Figure 6:
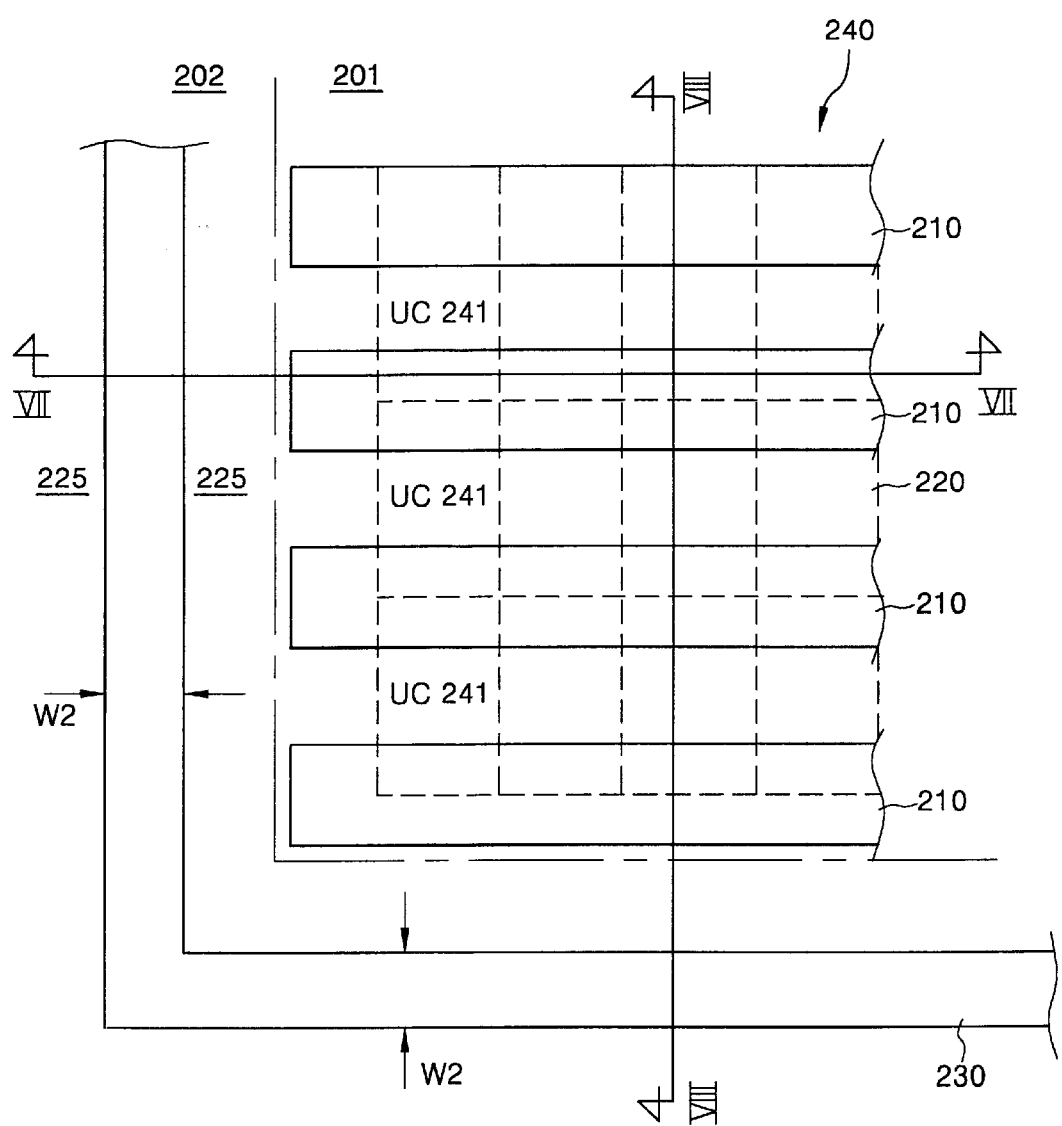
FIG. 6 is a simplified plan view illustrating a semiconductor memory device with a guard ring in accordance with exemplary embodiments of the present invention.

Referencing FIG. 6, a semiconductor memory device includes a memory cell region 201 and a periphery circuit region 202. As shown in FIG. 6, a one-dot line may depict the boundary between the two regions. The memory cell region 201 may include n-wells 210, p-wells 220 and a plurality of unit cells 241. The unit cells 241 may be arranged in a matrix form as shown by dotted lines of FIG. 6. The periphery circuit region 202 may comprise p-wells 225 and n-well 230. The n-well 230 is formed to surround a side portion of the array 240 of memory cells of memory cell region 201 and with width W2. N-well 230 is to serve as a guard ring for collection of electrons, e.g., that might be generated by a negative undershoot of a signal received by the memory devices.

In an exemplary embodiment, n-well 230 may be positioned at a location near n-wells 210 and p-wells 220. Yet, the depth of n-well 230 in the periphery circuit region 202 is formed deeper than that for n-wells 210 in memory cell region 201. As a result, electron collection efficiency may be improved (as might be influenced by an electric field generated by the guard ring) even though a width of the n-well 230 for the guard ring might be reduced, as might be provided with higher levels of integration. Further, because n-wells 210 of the memory cell region may be formed separate from, and with depths less than, the depth for n-well 230, an isolation margin between wells in the memory cell region may be improved or preserved even though the memory device design may evolve to higher levels of integration.

Further referencing FIG. 6, unit cell 241 of the memory cell region may comprise a full CMOS type SRAM cell. Certain details of the CMOS cells—e.g., impurity regions, gate electrodes, etc—are deemed to be well understood by persons skilled in this art. Accordingly, for purposes of clarity and simplicity in the present views, such details are not shown. Additionally, it is understood that although the layout structure of FIG. 6 may represent one exemplary embodiment or method of configuring an SRAM cell; such configuration may be varied by a person skilled in the art.

For example, instead of the full CMOS type SRAM, a DRAM cell might be employed for unit cell 241 in the memory cell region 201. When unit cell 241 in the memory cell region comprises the full CMOS type SRAM, the memory cell region 201 may comprise both n-wells 210 and p-wells 220. Alternatively, when unit cell 241 comprises DRAM cells, the memory cell region 201 may comprise only p-well 220. In such cases, various patterns of the DRAM cell may be applied.

Figure 7A:
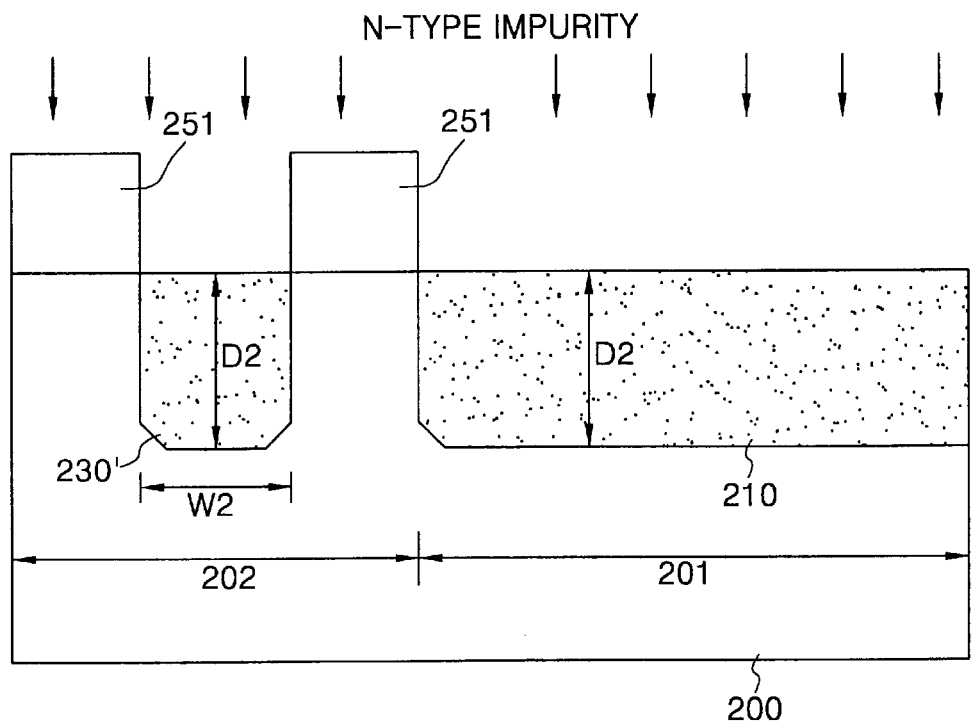
FIGS. 7A to 7C are simplified cross-sectional views taken along line VII—VII of FIG. 6, illustrating stages in a process according to exemplary embodiments of the present invention.
Figure 7B:
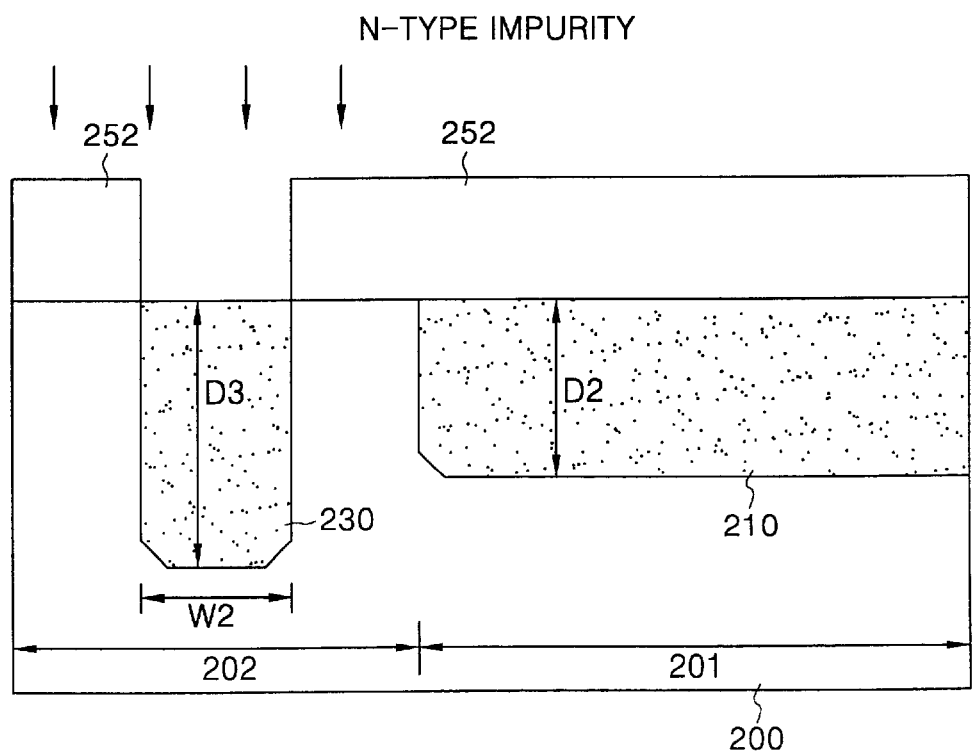
Figure 7C:
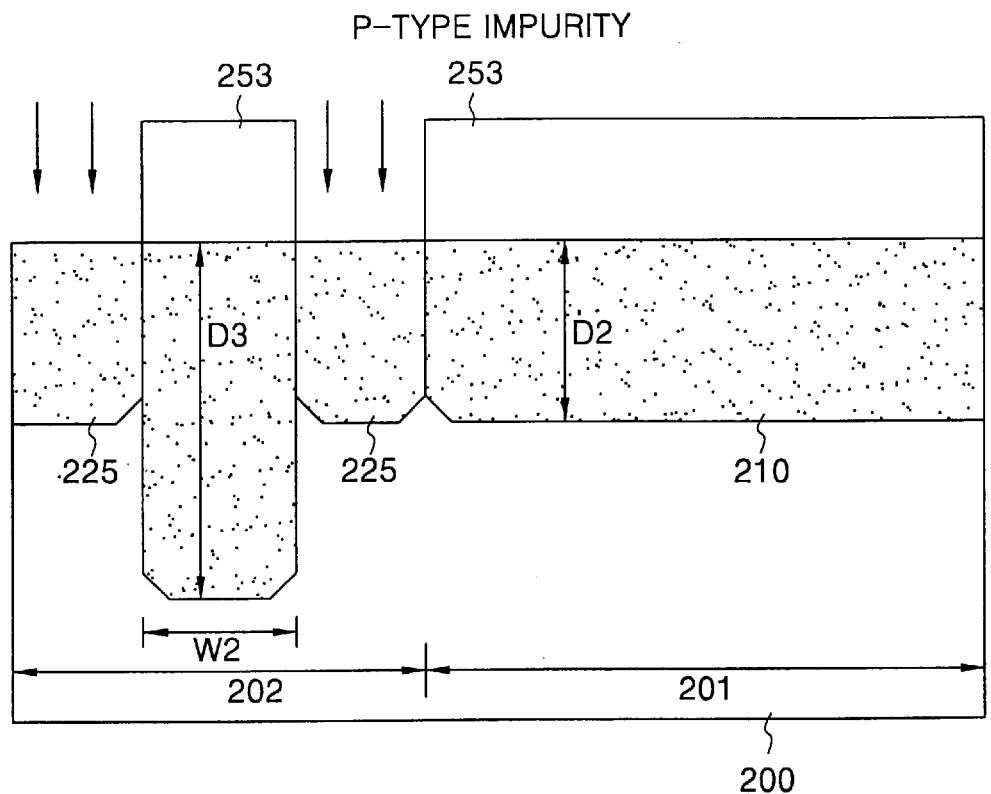
Figure 8A:
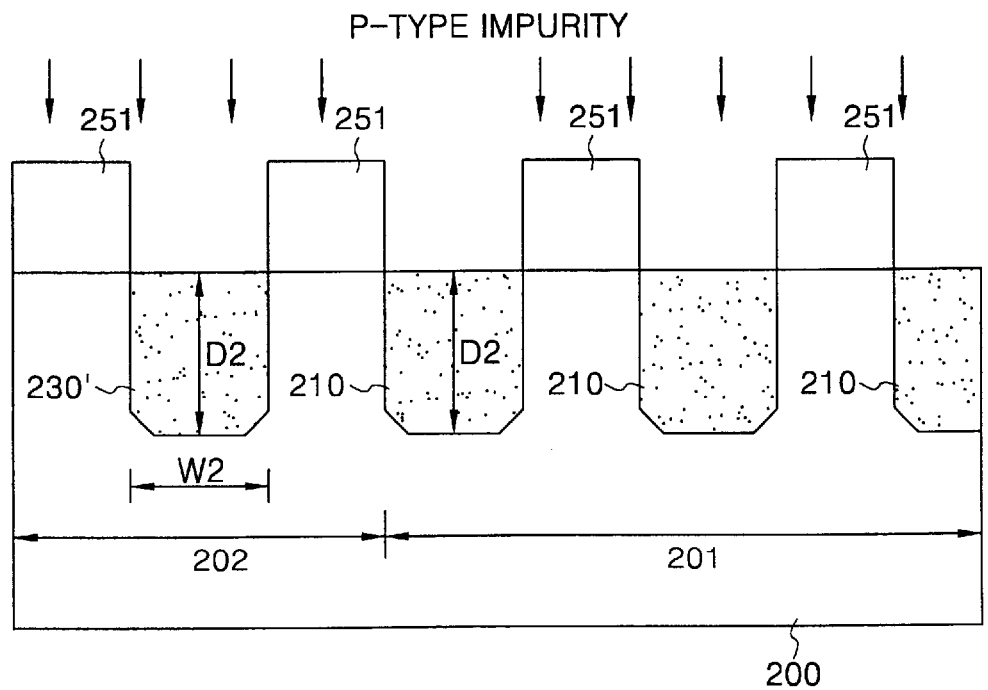
FIGS. 8A to 8C are simplified cross-sectional views taken along line VIII—VIII of FIG. 6 illustrating stages in a process according to exemplary embodiments of the present invention.
Figure 8B:
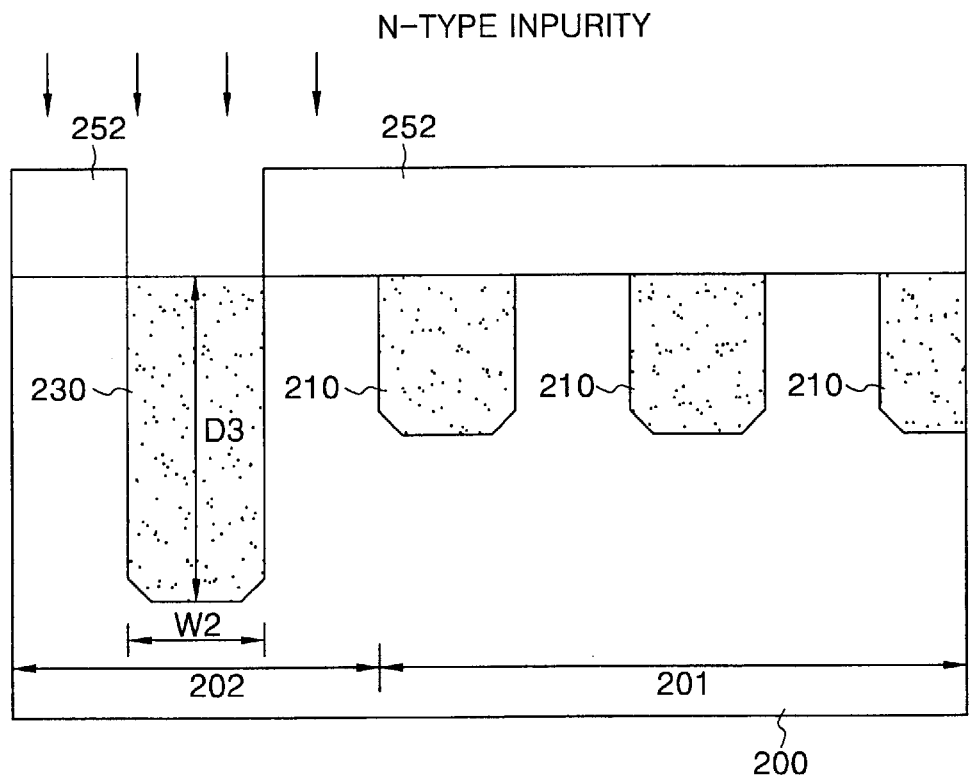
Figure 8C:
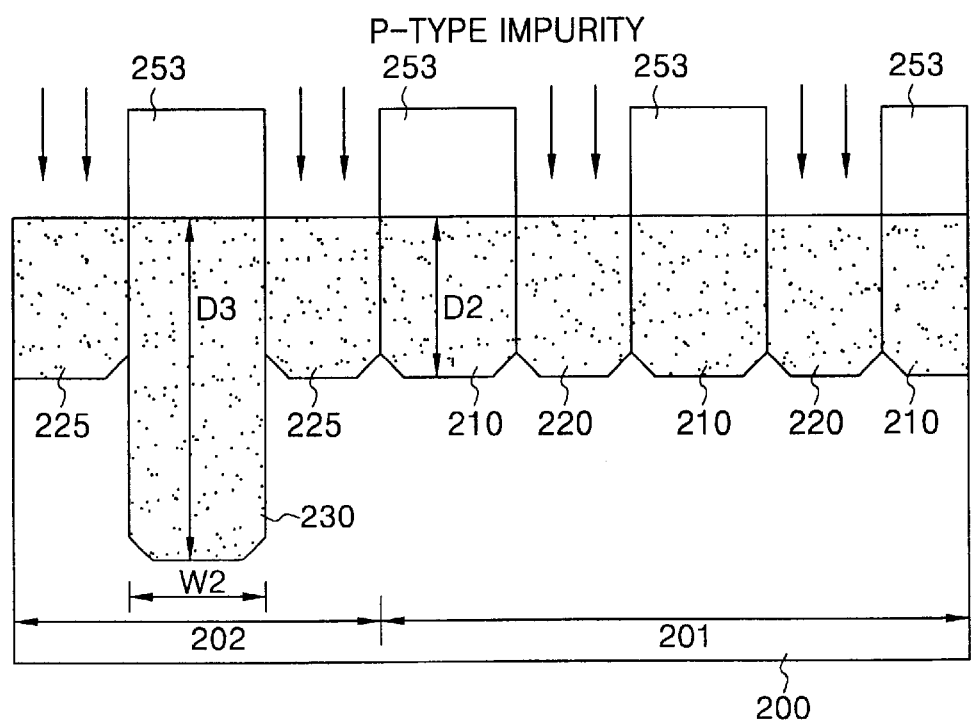

An exemplary process of manufacturing a semiconductor memory device of FIG. 6 is now explained with reference to FIGS. 7A to 7C and 8A to 8C, in which FIGS. 7A to 7C provide simplified cross-sectional views taken along line VII—VII of FIG. 6, while FIGS. 8A to 8C provide simplified cross-sectional views taken along line VIII—VIII.

Referring to FIGS. 7A and 8A, a first mask pattern 251 may be formed to expose regions of the p-type semiconductor substrate 200 that are to receive an impurity implant. N-type impurities may then be ion-implanted into the exposed regions of the substrate as defined by the first mask pattern 251 to form n-wells 210 and 230' in the memory cell region 201 and in the periphery circuit region 202, respectively. Formed by a common implant process, the n-wells 210 and 230' will have similar depths D2.

Moving forward with reference to FIGS. 7B and 8B, the first mask pattern 251 may be removed, and a second mask pattern 252 formed over the semiconductor substrate to expose a portion of the semiconductor substrate 200 corresponding to the n-well 230' in the periphery circuit region 202. Defined according to the second mask pattern 252, the exposed region receives n-type impurities from another ion-implant to form n-well 230 of the periphery region. An ion implantation energy used to form n-well 230 in the periphery region is higher than the energy used for the implant to form n-well 230'. Therefore, the latter n-well 230 formation obtains a depth D3 deeper than depth D2. For example, depth D3 may be formed at least 0.1 $\mu$m as deep or deeper than that of the n-well 230'.

Figure 2A:
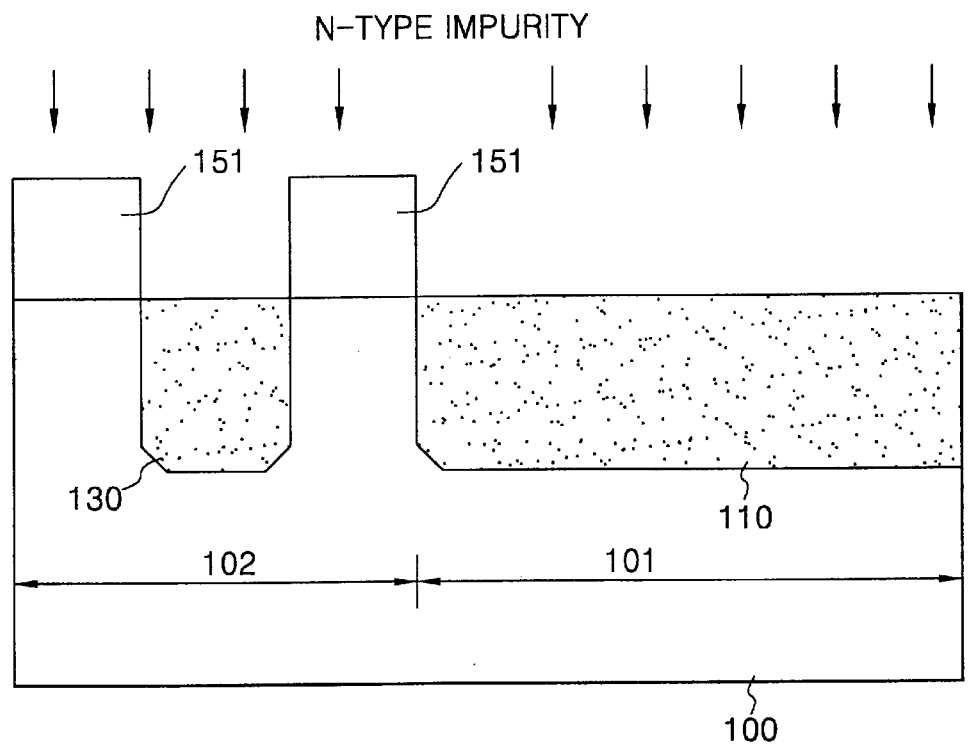
FIGS. 2A and 2B are cross-sectional views taken along line II—II of FIG. 1.
Figure 2B:
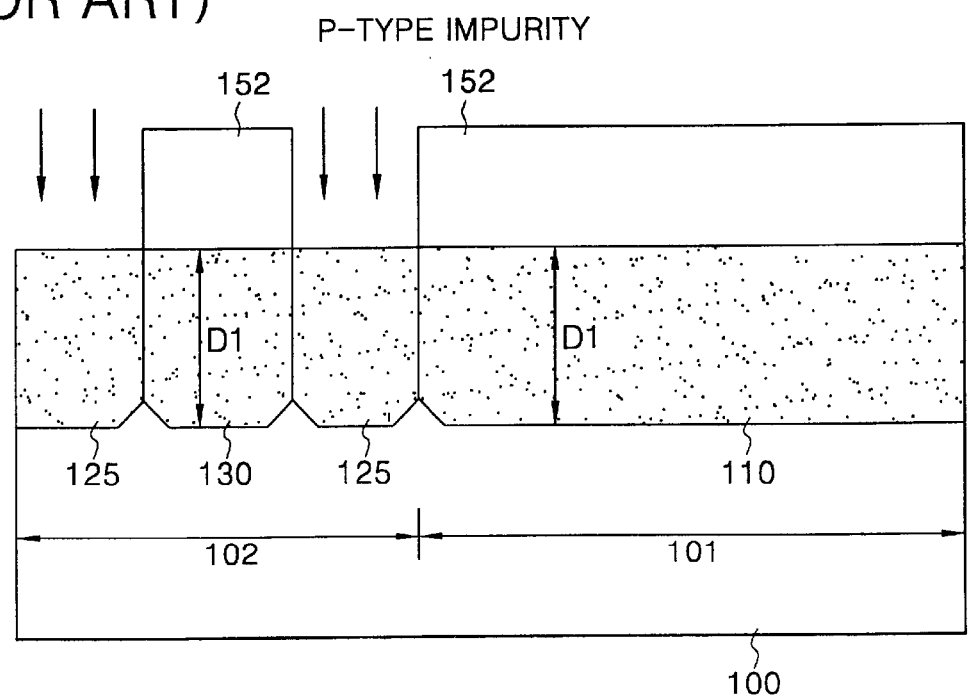
Figure 3A:
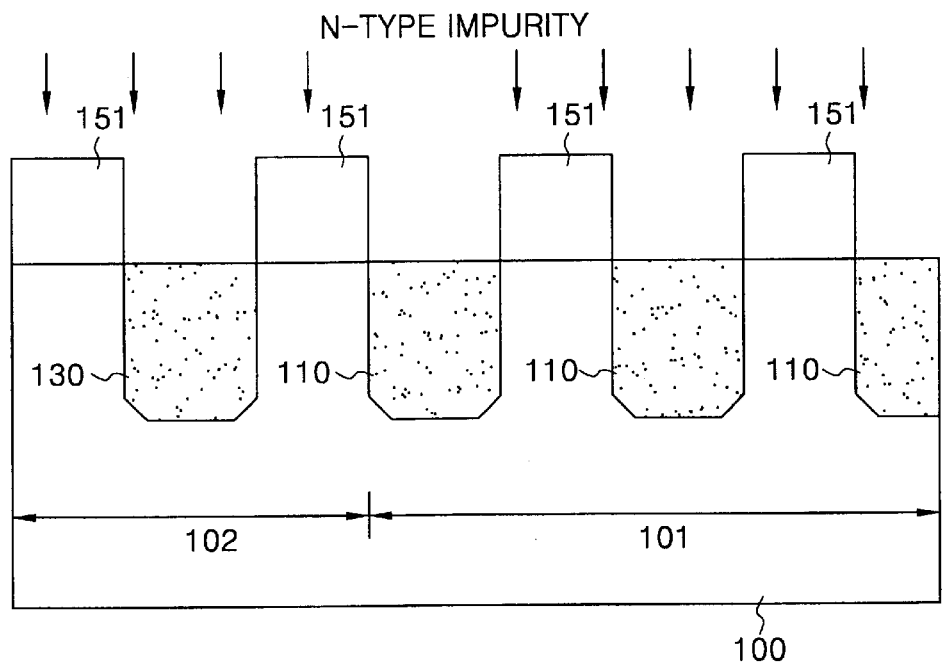
FIGS. 3A and 3B are cross-sectional views taken along line III—III of FIG. 1.
Figure 3B:
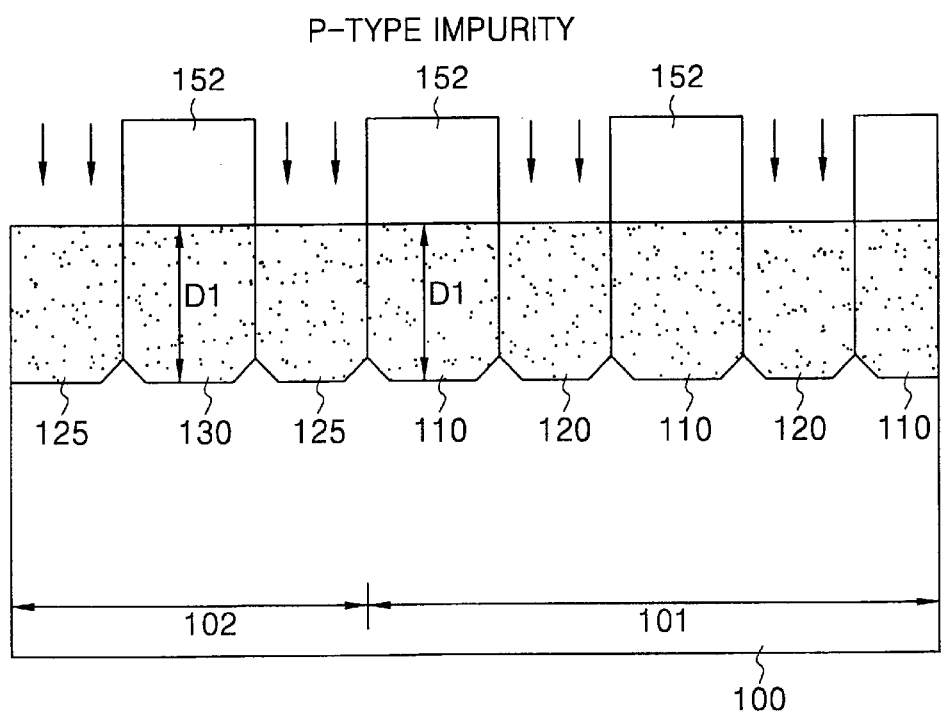
Figure 4:
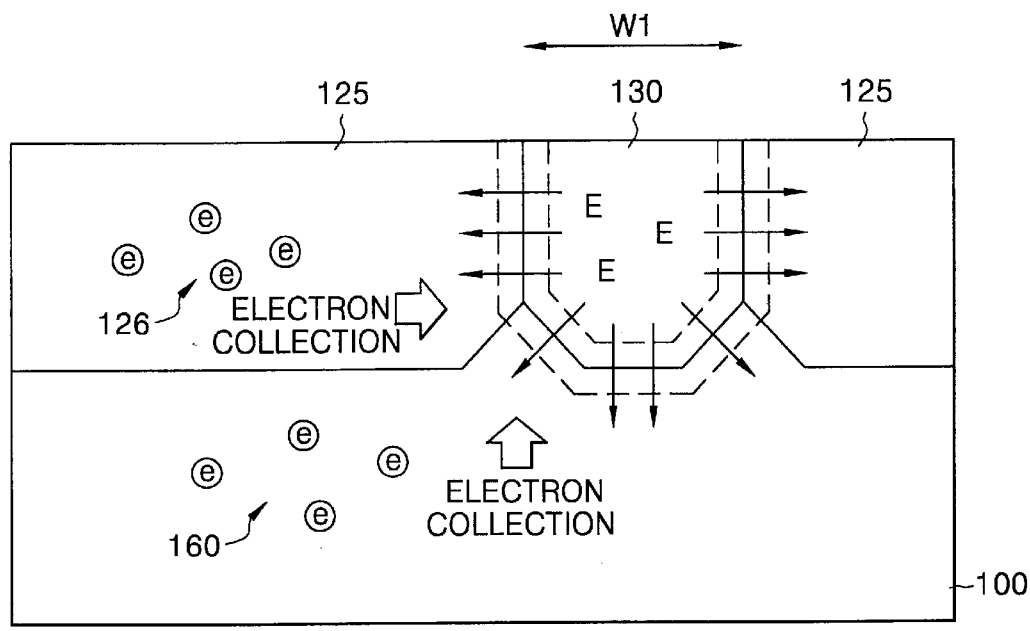
FIG. 4 is a cross-sectional view illustrating a principle of electron collection by a guard ring.
Figure 5:
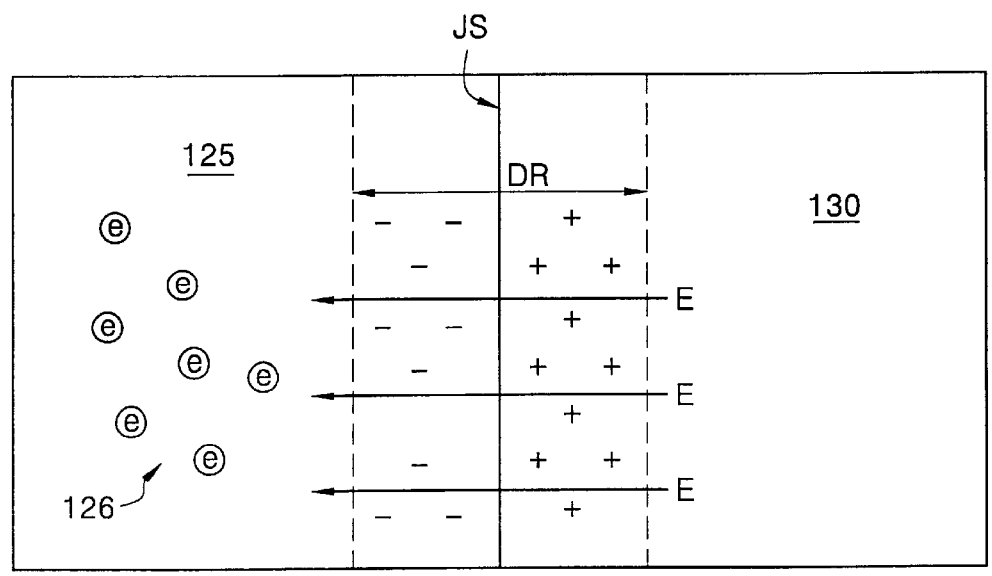
FIG. 5 is a plan view illustrating an electric field that may be generated through a depletion region and across a PN junction between an n-well and a p-well.

As a result, since n-well 230 in the periphery circuit region 202 may be formed with a depth deeper than, and separately from the formation of, n-wells 210 in the memory cell region 201, it may have a width W2 reduction (i.e., relative to previous designs such as width W1 of the n-well 130 of FIG. 2a) without suffering a reduced electric field area. In fact, with an increased depth, its electric field area may increase to improve its electron collection efficiency. Furthermore, since the n-well 210 in the memory cell region 201 depth can be formed with depth different and less than that of the n-well 230 in the periphery circuit region 202, lateral diffusion of implants may be controlled in the memory cell region, which lateral diffusions might otherwise affect an isolation between wells and transistor dopant regions thereof (not shown).

Referencing FIGS. 7C and 8C, second mask pattern 252 may be removed, and a third mask pattern 253 formed over the semiconductor substrate to expose areas of the semiconductor substrate 200 desired for p-wells. P-type impurities may then be ion-implanted into regions of the semiconductor substrate that are defined by the third mask pattern 253 in order to form p-wells 220 and 225. The p-wells 220 may be formed between n-wells 210 in the memory cell region 201, while p-wells 225 may be formed in the periphery circuit region 202 on opposite sides of interposing n-well 230. The p-wells 220 and 225 (referencing FIG. 6) may be formed to contact each other.

In exemplary embodiments, a full CMOS type SRAM cell may be used in the semiconductor memory device. Alternative exemplary embodiment may use a high load resistor (HRL) type SRAM cell or thin film transistor (TFT) type SRAM cell.

FIGS. 9A to 9C and 10A to 10C provide simplified cross-sectional views for illustrating other processes of manufacturing the semiconductor memory device in accordance with further exemplary embodiments of the present invention.

Figure 9A:
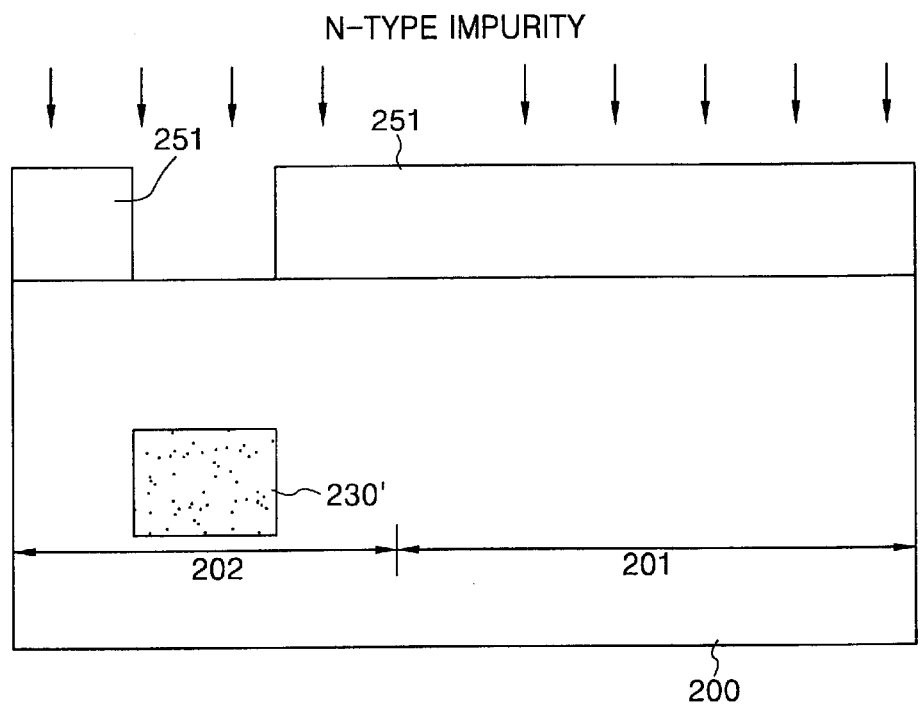
FIGS. 9A to 9C and 10A to 10C are simplified cross-sectional views illustrating processes of manufacturing a semiconductor memory device in accordance with further exemplary embodiments of the present invention.
Figure 10A:
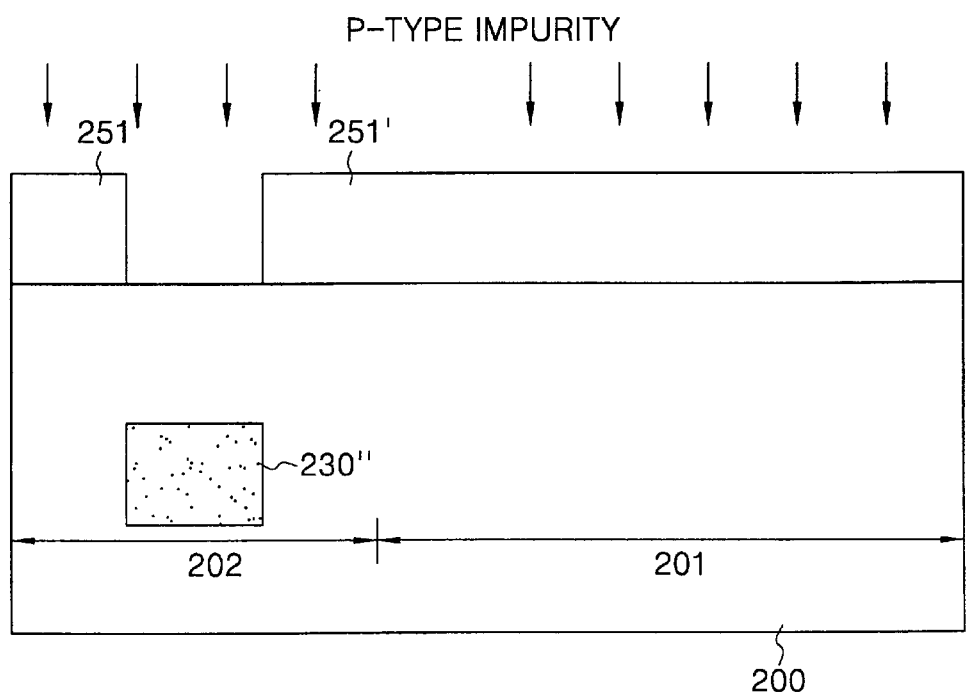

As shown in FIGS. 9A and 10A, a first mask pattern 251 may be formed over a semiconductor substrate to expose regions of semiconductor substrate 200 desired for an n-well in a periphery circuit region 202 of the substrate. The exposed regions as defined by the first mask pattern 251 may then receive n-type impurities of an ion-implant to form an n-well 230' (n-well 230" in FIG. 10A). The penetration depth (i.e., a distance from a surface of the semiconductor substrate 200) for these impurities of n-well 230' depends on an intensity of the ion implantation energy.

Figure 9B:
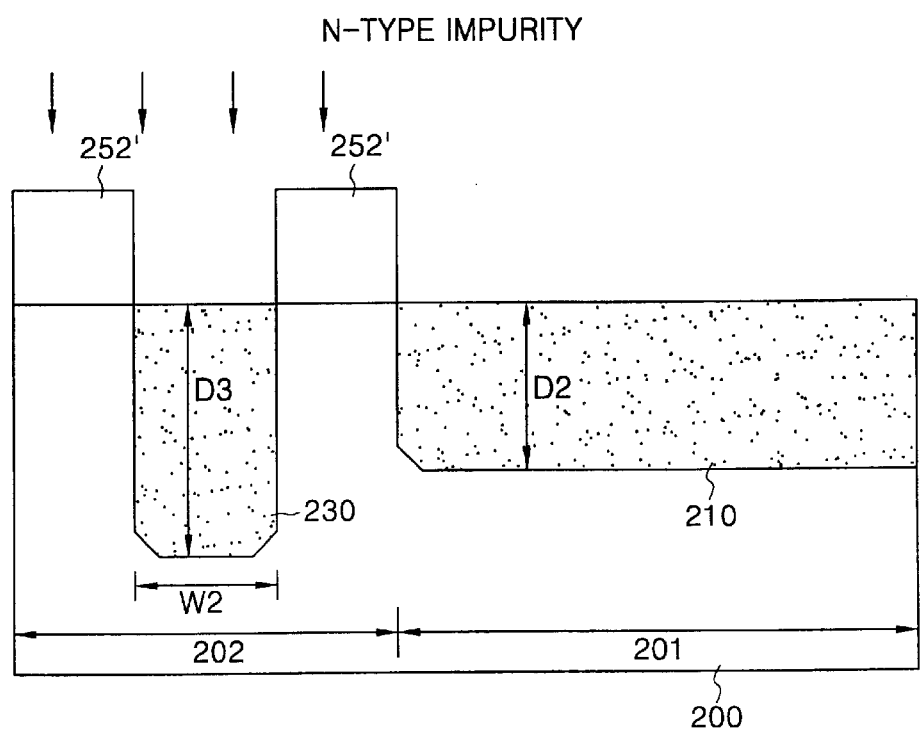
Figure 10B:
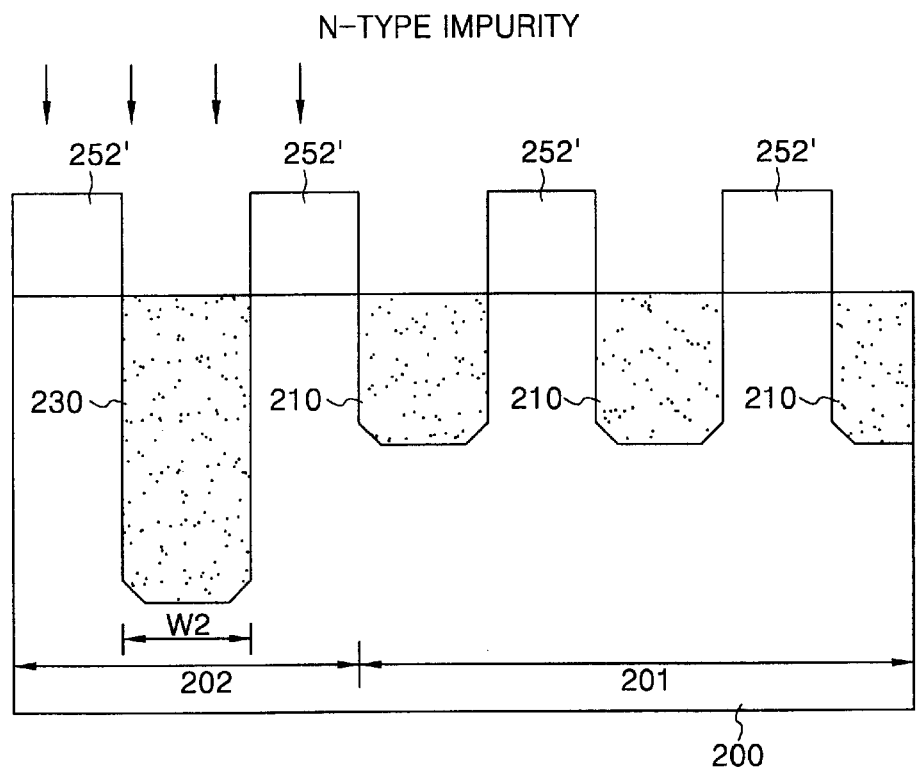

Next, as shown in FIGS. 9B and 10B, after removing the first mask pattern 251, a second mask pattern 252 may be formed to expose a portion of the p-type semiconductor substrate 200 as desired for the n-wells. Exposed areas of the semiconductor substrate as defined by the second mask pattern 252, may then receive n-type impurities of an ion-implant to form n-wells 210 and 230. The ion implantation energy used during the formation of n-wells 210 may be lower than that which was used to form the previously discussed n-well 230'. Thus, the n-wells of the memory cell region 201 may be formed with a depth less than that of the n-well 230 which is to act as the guard ring.

Figure 9C:
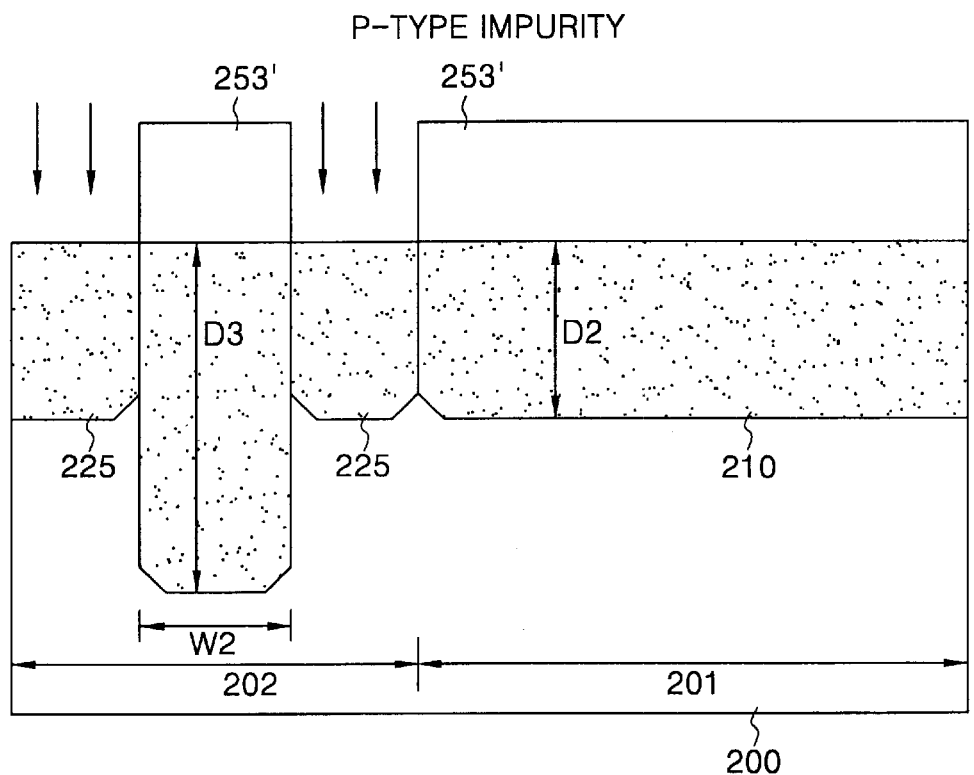
Figure 10C:
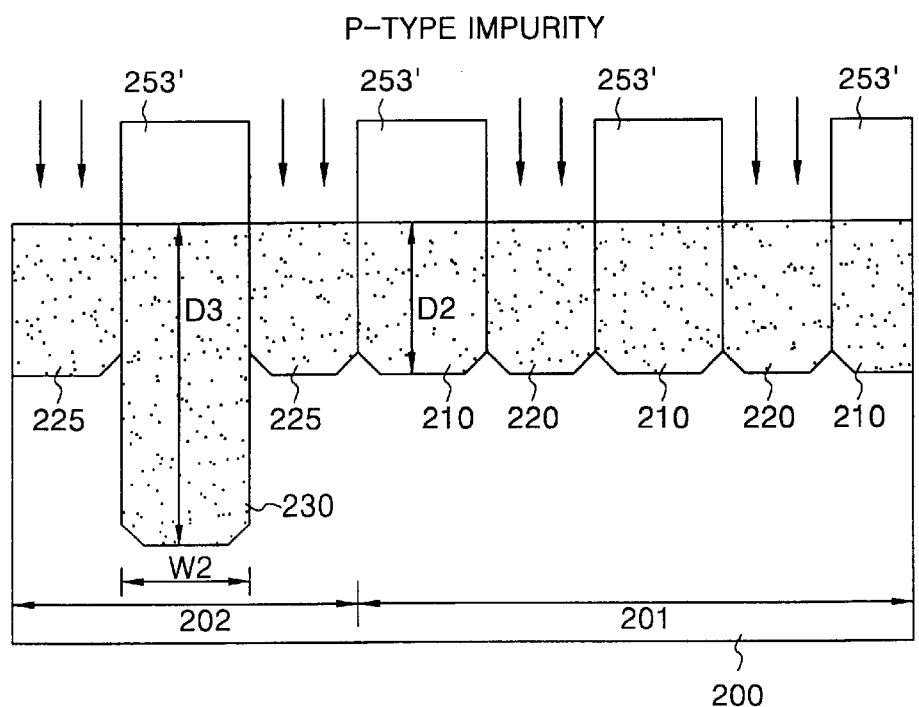

Further referencing FIGS. 9C and 10C, after removing second mask pattern 252, a third mask pattern 253 may be formed over the semiconductor substrate to expose a portion of the semiconductor substrate 200 desired for p-wells. The exposed areas of the semiconductor substrate as defined by the third mask pattern 253 may then receive p-type impurities from an ion-implant to form p-wells 220 and 225. P-wells 220 may be formed between n-wells 210 in the memory cell region 201, and p-wells 225 may be formed in the periphery circuit region 202 on separate sides of n-well 230.

In accordance with further exemplary embodiments of the present invention, additional n-wells (not shown) might be provided in the periphery circuit region and PMOS transistors may also be formed therein. Referencing FIG. 11, a semiconductor memory device may comprise n-wells 360 in a periphery circuit region 302 and n-wells in other portions of the substrate, similarly, as described previously herein relative to FIG. 6. The additional n-wells 360 may allow formation of PMOS transistors in the periphery circuit region 302.

Figure 11:
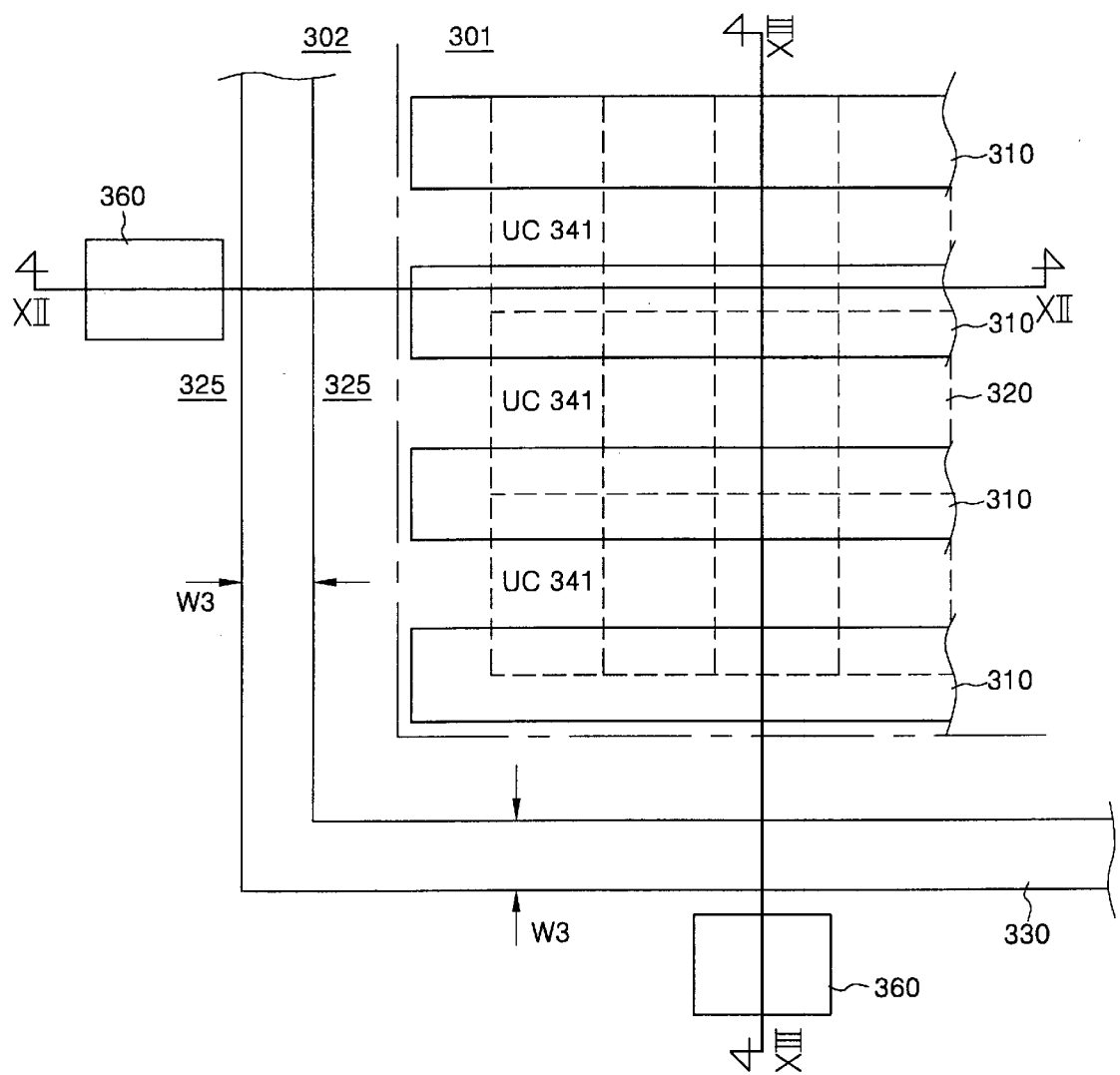
FIG. 11 is a simplified plan view illustrating a semiconductor memory device according to another exemplary embodiment of the present invention.
Figure 12:
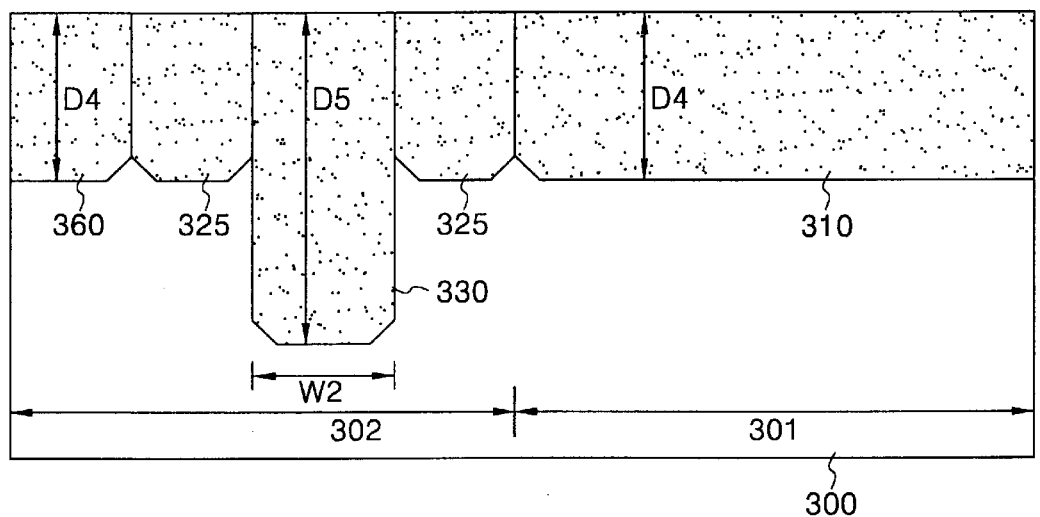
FIG. 12 is a simplified cross-sectional view taken along line XII—XII of FIG. 11.
Figure 13:
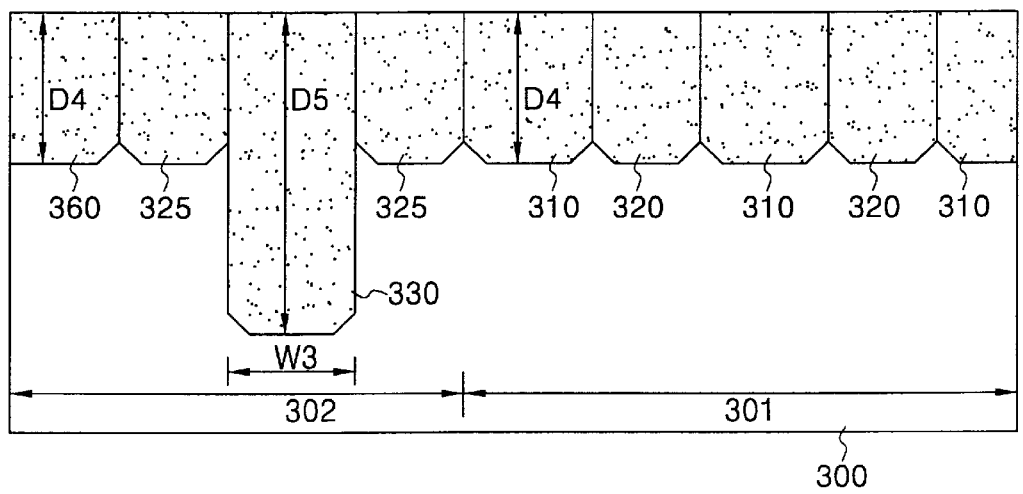
FIG. 13 is a simplified cross-sectional view taken along line XIII—XIII of FIG. 11.

In addition, a process of manufacturing a semiconductor memory device according to further exemplary embodiments of the present invention may be explained with reference to FIGS. 12 and 13, in which. FIG. 12 provides a simplified cross-sectional view taken along line XII—XII of FIG. 11, and FIG. 13 provides a simplified cross-sectional view taken along line XIII—XIII of FIG. 11. N-wells 310 and 360 are formed in the memory cell 301 and in the periphery circuit regions 302 respectively via a first ion implantation process. Thereafter, n-well 330 that is to act as the guard ring, may be formed in the periphery circuit region 302 through a second ion implantation process. In this exemplary embodiment, n-well 330 is formed with a depth deeper than that of the n-wells 310 and 360. Finally, and similarly as presented earlier herein relative to FIG. 7C, p-wells 320 and 325 (FIGS. 12–13) may be formed through a third ion implantation process.

In accordance with an alternative process of manufacturing the semiconductor memory device, with further reference to FIG. 11, n-well 330 that is to act as the guard ring may be formed in the periphery circuit region 302 through a first ion implantation process. Thereafter, n-wells 310 and 360 may be formed in the memory cell region 301 and periphery circuit region 302 respectively through a second ion implantation process. Again, n-well 330 is formed with a depth deeper than that of the n-wells 310 and 360.

In the exemplary embodiments for the semiconductor memory device of FIG. 11, n-well 330 that is to act as the guard ring may comprise a depth that is at least 0.1 μm as deep or deeper than that of the n-well 310 and 360.

As described hereinbefore, since the n-well that is to act as the guard ring may be formed deeper than the other n-wells, the semiconductor memory device may offer some advantages. For example, exemplary embodiments of the present invention may allow extended levels of integration without compromising an isolation margin between wells within the memory cell region. Also, since an electric field area of the guard ring may increase, an electron collection efficiency thereof may be improved and a noise tolerance for the memory device similarly improved.

While the invention has been shown and described with reference to particular exemplary embodiments, it will be understood by those skilled in the art that changes in form Accordingly, such changes and modifications are considered to fall within the scope of the appended claims

What is claimed is:

1. A memory device, comprising:
  a semiconductor substrate;
  an array of memory cells within a memory cell region of the semiconductor substrate;
  first and second conductivity-type wells in the semiconductor substrate including the memory cell region; and
  a guard ring in a periphery circuit region of the semiconductor substrate outside the memory cell region; the guard ring surrounding a side of the array of memory cells, and
  the guard ring comprising a depth deeper than that of the second conductivity-type wells of the memory cell region, the guard ring being separated from the second conductivity type wells of the memory cell region.

2. The device of claim 1, wherein the semiconductor substrate comprises the same conductivity type as the wells of the first conductivity type, and the guard ring comprises material of the second conductivity type.

3. The device of claim 2, where the semiconductor substrate comprises a p-type semiconductor substrate and the guard ring comprises an n-well.

4. The device of claim 1, wherein the guard ring comprises a depth that is at least 0.1 μm deeper than that of the second conductivity type wells of the memory cell region.

5. The device of claim 1, wherein the array of memory cells comprises DRAM memory cells.

6. A semiconductor memory device, comprising:

a semiconductor substrate of a first conductivity type, the semiconductor substrate comprising a memory cell region and a periphery circuit region;

first and second conductivity type wells in the memory cell region;

an array of memory cells formed on the first and second conductivity type wells in the memory cell region;

a first conductivity type well in the periphery circuit region adjacent to the first and second conductivity type wells of the memory cell region; and a second conductivity type well in the periphery circuit region;

the second conductivity type well of the periphery circuit region adjacent to the first conductivity type well of the periphery circuit region, surrounding a side portion of the memory cell region and having a depth deeper than that of the second conductivity type well of the memory cell region.

7. The device of claim 6, wherein the first conductivity type of the semiconductor substrate is p-type, and the second conductivity type is n-type.

8. The device of claim 6, wherein the array of memory cells comprises DRAM memory cells.

9. A semiconductor memory device, comprising:

a semiconductor substrate comprising a memory cell region and a periphery circuit region;

a first conductivity type well within the memory cell region; and a guard ring within the periphery circuit region surrounding a side portion of the memory cell region;

the guard ring comprising a depth deeper than that of the first conductivity type well, the guard ring being separated from the first conductivity type well of the memory cell region.

10. The device of claim 9, wherein the guard ring comprises a well of second conductivity type, the conductivity type of the second opposite to that of the first.

11. The device of claim 10, wherein the semiconductor substrate comprises a p-type semiconductor substrate, and the guard ring comprises an n-well.

12. The device of claim 9, wherein the guard ring comprises a depth that is at least 0.1 $\mu$m deeper than that of the well of the first conductivity type.

13. The device of claim 9, wherein the semiconductor memory device comprises DRAM cells.

14. A semiconductor memory device, comprising:

a semiconductor substrate of a first conductivity type, the semiconductor substrate comprising a memory cell region and a periphery circuit region;

first conductivity type wells in the memory cell region and the periphery circuit region; and a well of second conductivity type in the periphery circuit region to surround a side portion of the memory cell region;

the well of second conductivity type in the periphery circuit region comprising a depth deeper than that of the first conductivity type well of the memory cell region.

15. The device of claim 14, wherein the semiconductor substrate comprises a p-type semiconductor substrate, and the well of the first conductivity type comprises an n-well.

16. The device of claim 14, wherein the semiconductor memory device comprises DRAM cells.

* * * * *

UNITED STATES PATENT AND TRADEMARK OFFICE
CERTIFICATE OF CORRECTION

PATENT NO.    : 6,583,486 B2
DATED         : June 24, 2003
INVENTOR(S)   : Kim Han-Soo It is certified that error appears in the above-identified patent and that said Letters Patent is hereby corrected as shown below:

<u>Column 8,</u>
Line 38, "circuit region 202" should read -- circuit region 220 --.

<u>Column 10,</u>
Line 37, "in form Accordingly" should read -- in form and details may be made therein without departing from the spirit and scope of the invention. Accordingly --.

Signed and Sealed this

Thirteenth Day of April, 2004

JON W. DUDAS
*Acting Director of the United States Patent and Trademark Office*